United States Patent [19]

Lobry et al.

[11] Patent Number: 4,797,996

[45] Date of Patent: Jan. 17, 1989

[54] DEVICE FOR CENTERING PREFORMED COMPONENTS FOR THE FLAT IMPLANTATION THEREOF BY MEANS OF AN AUTOMATIC SETTING MACHINE

[75] Inventors: Claude Lobry, Genlis; Didier Trutt, Auxonne, both of France

[73] Assignee: Societe Orega Electronique Et Mecanique, Paris, France

[21] Appl. No.: 88,310

[22] Filed: Aug. 24, 1987

[30] Foreign Application Priority Data

Aug. 25, 1986 [FR] France ................................. 86 12042

[51] Int. Cl.[4] ............................................. B23P 19/04
[52] U.S. Cl. ...................................... 29/740; 29/741; 29/759; 279/1 L
[58] Field of Search ................. 29/740, 739, 741, 759, 29/832, 834; 414/754, 781; 198/390, 394; 279/1 L

[56] References Cited

U.S. PATENT DOCUMENTS

| | | | |
|---|---|---|---|
| 3,339,704 | 9/1967 | Clark et al. | 198/394 |
| 3,344,900 | 10/1967 | Drop | 198/394 |
| 3,358,852 | 12/1967 | Fegley | 198/344 |
| 3,367,476 | 2/1968 | Aronstein et al. | 198/394 |
| 4,264,268 | 4/1981 | Monahan | 414/754 |
| 4,610,473 | 9/1986 | Hawkswell | 29/740 |
| 4,624,050 | 11/1986 | Hawkswell | 29/740 |

FOREIGN PATENT DOCUMENTS 0162115 11/1985 European Pat. Off. .

Primary Examiner—P. W. Echols
Attorney, Agent, or Firm—Oblon, Fisher, Spivak, McClelland & Maier

[57] ABSTRACT

A device is provided for centering components intended to be implanted in the flat condition and having at least one preformed pin for implantation thereof, the device including two pairs of jaws perpendicular to each other and having recesses for centering the components without damaging the pin during clamping of the jaws.

5 Claims, 1 Drawing Sheet

U.S. Patent   Jan. 17, 1989   4,797,996
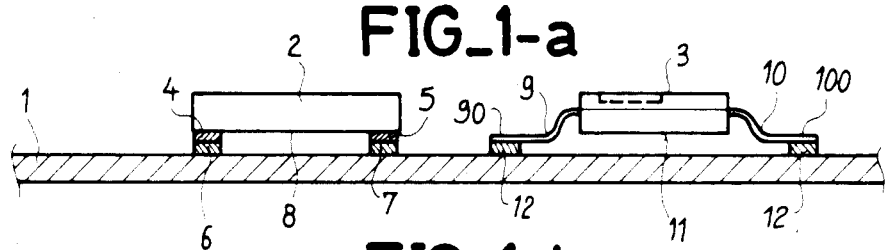
FIG_1-a
FIG_1-b
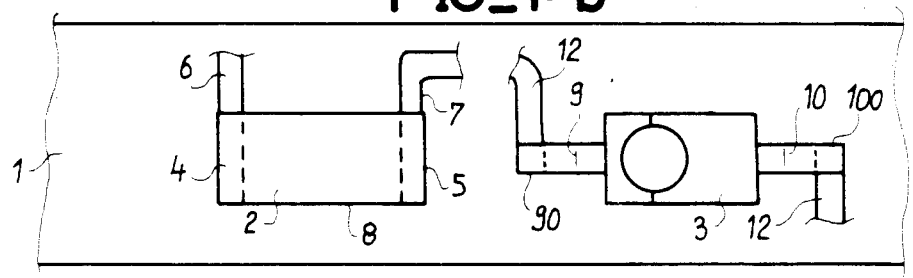
FIG_2
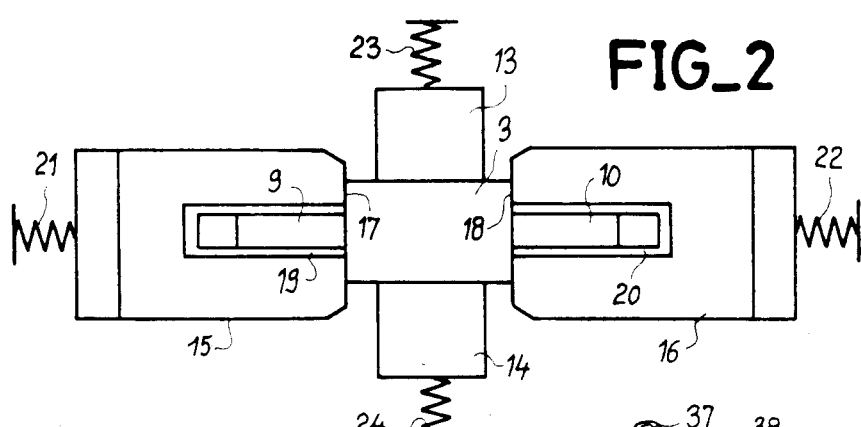
FIG_3

DEVICE FOR CENTERING PREFORMED COMPONENTS FOR THE FLAT IMPLANTATION THEREOF BY MEANS OF AN AUTOMATIC SETTING MACHINE

BACKGROUND OF THE INVENTION

The invention relates to a device for centering preformed components for the flat implantation thereof by means of an automatic setting machine.

For the construction of high frequency electronic circuits in particular, the technique called flat implantation of the components is more and more widely used. This technique consists in providing the electric contact of the component on the side of the printed circuit where its body is situated, that is to say in placing the body of the component and the connections on the side of the printed circuit where the conducting strips are situated. Contrary to the technique in which the printed circuit is pierced with holes for passing pins or lugs of the component therethrough and in which the body is placed on the side opposite that where the connections are provided, this technique reduces the parasite signals due to the radiation from the ends of the pins or lugs when the electronic circuit is operating.

Furthermore, the construction of circuits is automated more and more but the machines known up to now do not allow flat implantation of all the types of components. In fact, some components such as integrated circuits have been specially provided for flat implantation and, in a standard mode, these components have a chip package substantially in the form of a right angled parallelepiped with square or rectangular base. On the surface of the side of the chip carrier intended to face the circuit, that is to say the bottom of the chip carrier, flush conducting elements are provided ensuring the contact between the active part of the component and the printed circuit. Fixing to the printed circuit is either achieved by means of a conducting adhesive and, in this case, it is the contacts which are coated with adhesive, or through the chip carrier itself with a more conventional adhesive.

Other components intended to be implanted in the flat condition are also formed with a chip carrier, but the connection means are pins or lugs which project from at least one of the sides other than the top or bottom of the chip carrier. These pins or these lugs are preformed so that their free end is in the plane of the bottom of the chip carrier so that, when the bottom is on the printed circuit, the free end of each pin or lug may be in contact with a conducting strip of the printed circuit.

Thus diodes, transistors or other types of components are formed together with a chip carrier substantially in the form of a right angled parallelepiped.

For automatic implantation, an arm takes the components one by one and places them at given positions.

So that the positioning is correct, the components must be correctly positioned with respect to the arm, which means that before being picked up by the arm they must be accurately centered. Such centering is achieved by means of a device forming part of the insertion chain which is sometimes mounted for rotation so as to orient the component in a given way with respect to the manipulating arm so that the kinematics of this latter is the simplest possible.

The components are placed on the circuit by means of another manipulating arm, or any other device, which takes them from a supply magazine having compartments in which the components are placed one by one. The support is for example in the form of a strip and the components are taken from the compartments by a suction member associated with said other manipulating arm.

It is the centering phase which presents disadvantages and raises problems, to overcome which is the purpose of the present invention.

In fact, centering of standard type components takes place on a plate, possibly rotatable for correct orientation with respect to the implantation arm. The plate is provided with two pairs of jaws perpendicular to each other for clamping the sides, other than the bottom and the top of the chip carrier two by two. The jaws of each pair clamping two opposite sides move together and a the same speed relatively to one another. Consequently, when the four jaws are clamped, the component is centered.

Such a device cannot be used for centering preformed components for it means that the jaws clamp the lateral lugs or pins, which causes deformation thereof. Consequently, if this same supply magazine contains components of the two types, two different machines or two different methods must be provided for centering.

SUMMARY OF THE INVENTION

The component centering device of the invention, of the kind having two pairs of jaws perpendicular to each other for centering components encapsulated in a substantially parallelepipedic chip carrier, includes means for centering components having at least one connection pin or lug projecting from one of the sides of the chip carrier other than the bottom or the top of the chip carrier, without said pin or lug being damaged during the centering.

According to another characteristic, said means are such that they allow centering of components on which said pin or lug is preformed with its free end in the plane of the bottom of the chip carrier.

According to another feature, the device includes means for centering components having at least two pins or lugs on at least two sides other than the bottom and the top of the chip carrier.

The device of the invention is particularly advantageous for it may be used with all types of components adapted for flat implantation, and particularly with diodes or other preformed components with a view to their use in high frequency circuits.

BRIEF DESCRIPTION OF THE DRAWINGS

Other features and advantages of the invention will be clear from the description of a few embodiments with reference to the accompanying drawings in which:

FIGS. 1a and 1b recall the principle of flat implantation of components;

FIG. 2 is a general diagram of the device of the invention; and

FIG. 3 is a perspective view of the device shown in FIG. 2.

DESCRIPTION OF THE PREFERRED EMBODIMENTS

In FIGS. 1a and 1b a printed circuit 1 on which two components 2, 3 are implanted in the flat condition has been shown respectively in a side view and a top view.

The first component 2 is a standard component, that is to say whose conducting elements 4, 5 providing the connection with conducting strips 6, 7 of the printed circuit 1 are under the bottom 8 of its carrier.

This type of component is readily centered using known means with jaws before being gripped by the implantation arm.

The second component 3 is for example a diode mounted in a chip carrier of parallelepipedic shape.

Known devices with jaws do not allow centering thereof for they would crush the connection pins or lugs 9, 10 projecting here from two opposite sides of the carrier other than the bottom 11 and the top. Said lugs 9, 10 are preformed so that their free ends 90, 100 are in the extension of the plane of the bottom 11, so that they may engage conducting strips 12 of the printed circuit.

It will be readily understood that, in these Figures, the dimensions have been largely exaggerated for better showing the component elements.

FIG. 2 shows, in a top view, the principle of one embodiment of the device according to the invention for centering a preformed component without damaging the connecting lugs or pins 9, 10.

In this Figure, the component 3 of FIGS. 1a and 1b has been shown and the device for centering it.

The device is more particularly adapted for centering components whose two opposite sides are each provided with at least one preformed pin 9, 10.

The device includes two pairs of jaws 13, 14 and 15, 16 perpendicular to each other. So that the jaws 15, 16 facing the sides where pins 9, 10 are located do not damage them, these jaws are adapted to engage the sides 17, 18 of the carrier of the component whence the pins emerge without touching said pins.

For that, the jaws 15, 16 considered are provided over the whole of their height, preferably at their center, with recesses 19, 20 formed by machining, having dimensions greater than those of the pins, so that these latter engage in said recesses without coming into contact with them and so that the grips of said jaws 15, 16 engage the sides 17, 18 of the carrier whence the pins emerge.

In the case where the same side is provided with several pins, if the spacing between these pins allows it, as many recesses are formed so that the contact surface on the sides is increased, if not a single recess is formed in which all the pins of the same side are engaged. In this latter case, the jaws come to bear close to the ends of the side.

In this Figure, means have also been shown for clamping the jaws, which are symbolized by springs 21, 22, 23, 24. It will in fact be readily understood that, for controlling the spacing and for causing the two jaws of the same pair to advance simultaneously, coupling means between these jaws are provided, which means are known per se in devices for centering standard components intended to be implanted in the flat condition.

An operation for centering a component having at least two pins on two opposite sides of its carrier takes place as follows:

the jaws 13, 14 are first of all clamped on the sides without pins. When they are clamped, it is certain that pins 9, 10 on the other sides are in alignment with the recesses intended to receive them, and it is then sufficient to clamp the jaws 15, 16 having these recesses. No risk of deformation of the pins is then possible.

In the case of a circuit having pins on more than two sides, the pins on the side or sides whose jaws are clamped first must be opposite the recesses of these jaws before carrying out clamping.

In this case, guide means are provided for positioning said pins correctly with respect to the recesses of the jaws clamped first.

FIG. 3 shows a complete centering device in accordance with the invention.

A plate 25 serves as base for the assembly. This plate may be rotary so as to provide an orientation function complementary to the centering, for facilitating the kinematics of the manipulating arm laying the components on the printed circuit.

Jaws 13, 14, 15, 16 are removable in the preferred embodiment, which allows several sets of jaws to be used with the same device, depending on the structure and/or on the size of the components to be centered. The device may then be used exclusively for standard circuits, with solid jaws, or for standard circuits and preformed circuits with recessed jaws.

A structure for guiding the jaws is provided on plate 25, which has the shape of four guides perpendicular to each other, in the center 26 of which centering is provided. The guides are for example pairs of lateral rails 27, 28, 29, 30, 31, 32 between which slide carriages 33, 34, 35, 36 on which the jaws 13, 14, 15, 16 may be fixed respectively one by one.

Securing to the carriages may be provided means of screws 37, 38.

In a variant, the carriage jaw assemblies are each constructed as a monobloc structure. Changing a jaw then involves changing the carriage.

An additional advantage of the invention resides in the fact that it may be constructed inexpensively from a device already existing for centering standard components for surface mounting thereof.

What is claimed is:

1. A device for centering components encapsulated in a chip carrier having substantially parallelpipedic sides and having at least one connection pin or lug on at least one of the sides of the carrier other than the top and bottom thereof, comprising:

two mutually perpendicular pairs of jaws, each of said pairs of jaws being movable such that at least one surface of each jaw of said two pairs of jaws engages one of the sides of a component supported by a supporting means;

at least one recess formed in said at least one surface of each jaw of one of said pairs of jaws, each said recess having such a size and being formed at such a position on said at least one surface that said jaw does not engage a connection pin or lug extending from the side engaged by said at least one surface; and means for moving said jaws, comprising a carriage guided by lateral rails perpendicular to each other two by two and carried by a plate.

2. The device as claimed in claim 1, wherein said jaws are removable with respect to the carriages.

3. The device as claimed in claim 1, wherein said jaws are fixed with respect to the carriages.

4. The device as claimed in claim 1 wherein said means for moving comprise means for simultaneously clamping both jaws of the same pair.

5. The device as claimed in claim 1 wherein said plate is rotary.

* * * * *